(12) United States Patent
Takeuchi et al.

(10) Patent No.: US 6,505,312 B1
(45) Date of Patent: Jan. 7, 2003

(54) INTEGRATED CIRCUIT TESTER

(75) Inventors: Nobuaki Takeuchi, Tokyo (JP);
Yoshiki Yanagisawa, Tokyo (JP);
Chitomi Terayama, Tokyo (JP);
Takayuki Sugizaki, Tokyo (JP)

(73) Assignee: Ando Electric Co., LTD, Tokyo (JP)

( * ) Notice: Subject to any disclaimer, the term of this patent is extended or adjusted under 35 U.S.C. 154(b) by 0 days.

(21) Appl. No.: 09/510,362

(22) Filed: Feb. 22, 2000

(30) Foreign Application Priority Data

Feb. 24, 1999 (JP) .......................................... 11-047225

(51) Int. Cl.[7] ........................ G11B 20/20; G01R 31/308
(52) U.S. Cl. ....................................... 714/700; 324/753
(58) Field of Search ................................. 324/753, 754, 324/96; 327/156, 244; 714/700

(56) References Cited

U.S. PATENT DOCUMENTS

| 5,142,224 A | * | 8/1992 | Smith et al. ................. 324/753 |
| 5,272,434 A | * | 12/1993 | Meyrueix et al. ............ 324/753 |
| 5,767,688 A | * | 6/1998 | Takahashi et al. ........... 324/753 |
| 5,847,570 A | * | 12/1998 | Takahashi et al. ........... 324/753 |
| 5,854,804 A | * | 12/1998 | Winer et al. .................... 372/38 |

* cited by examiner

Primary Examiner—Albert Decady
Assistant Examiner—Shelly A Chase
(74) Attorney, Agent, or Firm—Burns, Doane, Swecker & Mathis L.L.P.

(57) ABSTRACT

Pins of an integrated circuit are provided with timing axis signals for testing in the time axis without discrepancies. An electro-optic probe in proximity to a plurality of contact points of a device under test uses positions of equal distance or a pre-set distance as skew measurement points, and detects timing axis signals on each microstrip line, A phase detector detects the phase of the timing axis signals that the electro-optic probe detects, and a phase difference calculator finds the phase difference between the phase detected by the phase detector and a reference value. Phase control of the timing axis signals is carried out by a phase controller so as to cancel the obtained phase difference.

5 Claims, 1 Drawing Sheet

INTEGRATED CIRCUIT TESTER

BACKGROUND OF THE INVENTION

1. Field of the Invention

The present invention relates to an integrated circuit tester that tests an integrated circuit by applying a timing axis signal for testing.

2. Description of the Related Art

Timing axis signals output by an integrated circuit tester ("IC tester") used to test integrated circuits are classified according to the number of pins on the integrated circuit (for example, 1024 pins), and deviations in the timing axis ("skew") of these timing axis signals must be minimized as far as possible in order to increase the precision of the measurement. That is, at each pin of the integrated circuit, or specifically, at the pin contact point of the IC socket, etc., on which the semiconductor integrated circuit is mounted, the skew of the applied timing axis signals must be zero.

At the same time, the external dimensions of recent integrated circuits are being reduced in size, and in order to carry out testing of these integrated circuits using a conventional oscilloscope, a ground (or earth) is necessary. However, there are the problems that protecting the area for fabricating the ground pattern is difficult, and that with an oscilloscope, the testing probe may influence the timing axis signal applied to the integrated circuit because this test probe electrically contacts the electrode pad bound with a microstrip line when the signal detection is carried out. In addition, in order for the probe to make contact, electrode pads and seats that occupy a large area must be provided, and this interferes with reducing the size of the integrated circuit.

In consideration of the above-described problems, it is an object of the present invention to provide an integrated circuit tester that can supply a timing axis signal for testing that exhibit no time axis deviation at any pin by transforming the change in the electrical field of the device under test into optical properties of an element, uses an electro-optic probe such as an EOS that can extract the changes in these optical characteristics as an indirect electrical signal, detects the timing axis signal applied to each pin of the integrated circuit without direct electrical contact at a skew measurement point, and applies and controls a timing axis signal that cancels the phase differences on the microstrip line bound to each pin of the integrated circuit according to the detected output of the phase difference between this timing axis signal and a reference signal.

SUMMARY OF THE INVENTION

In order to attain the object, according to a first aspect, the integrated circuit tester provides microstrip lines that connect to a plurality of contact points of the device under test and supply timing axis signals for testing them; an electro-optic probe that is in proximity to these contact points, uses positions that are equidistant therefrom or pre-set distances therefrom as skew measurement points, and detects the timing axis signals on each microstrip line at these skew measurement points; and a phase detection means that detects the phase of the timing axis signals that this electro-optic probe detects; and wherein: a phase difference calculation means finds the phase difference between the phase detected by this phase detection means and the pre-set reference value, and a phase control means carries out phase control of the timing axis signals supplied to the microstrip lines so that the phase differences obtained by this phase difference calculation means are cancelled.

In addition, according to a second aspect, in this integrated circuit tester, the phase difference obtained by the phase difference calculation means is the value obtained under the condition that there is an equal distance from each contact point of the device under test to each skew measurement point.

In addition, according to a third aspect, in this integrated circuit tester, the value to be used is obtained by compensating the phase difference obtained by this phase difference calculation means based on a database value of the corresponding skew measurement point in the case that the distances from the contact points of the device under test to the skew measurement points are not identical.

In addition, according to a fourth aspect, in this integrated circuit tester, the skew measurement points used by the electro-optic probe are set on an insulating film applied to the microstrip line or a strip line having a part thereof exposed from this insulating film.

In addition, according to a fifth aspect, in this integrated circuit tester, a probe moving means is provided that moves the electro-optic probe according to the database value of the skew measurement point.

DETAILED DESCRIPTION OF THE INVENTION

Figure 1:
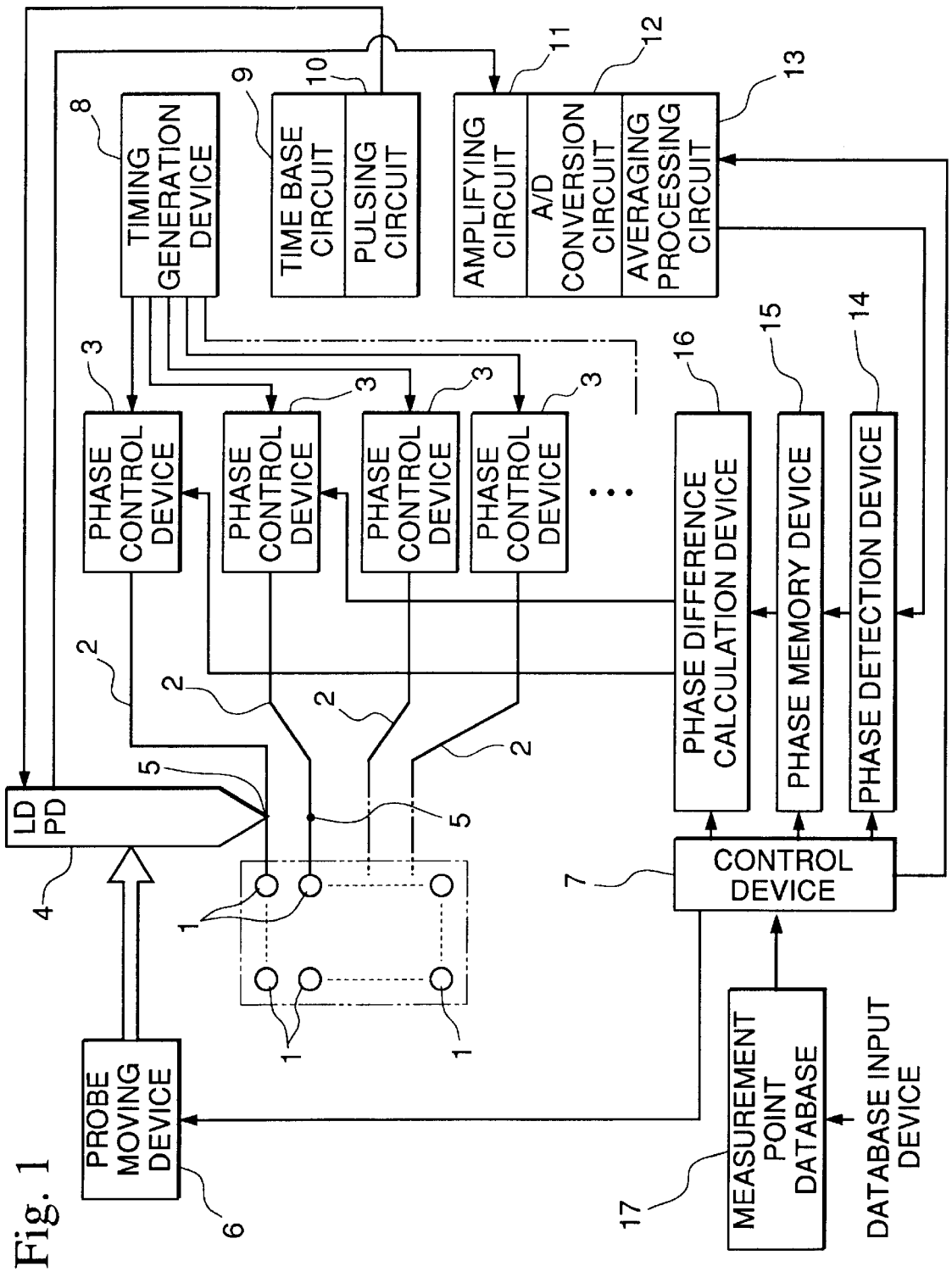
FIG. 1 is a block diagram showing the integrated circuit tester according to the first embodiment of this invention.

Hereinafter, a preferred embodiment of the present invention will be explained. FIG. 1 is a block diagram showing the integrated circuit tester according to an embodiment of the present invention. In this figure, reference numeral 1 denotes a plurality of contact points of the IC socket (not illustrated) on which the integrated circuit that is the device under test is mounted, and microstrip lines 2 connected to these contact points 1 that supply phase adjusted timing axis signals thereto. Moreover, these timing axis signals are supplied via the microstrip lines 2 corresponding thereto from each the phase control means 3. In addition, reference numeral 4 is an electro-optic probe that carries out, for example, optical signal detection (electrical field detection) on these microstrip lines 2 without making direct electrical contact with the microstrip lines 2.

This electro-optic probe 4 functions so as to use as respective skew measurement points 5 each position at the nearest equal distance or a distance on each microstrip line 2 of the measured points from each contact point 1 pre-set in a database, and further, to detect timing axis signals applied to each of the microstrip lines 2 by contacting each of these skew measurement points 5 in order. In addition, the movement of this electro-optic probe 4 is controlled by a probe movement means 6, and as described above, contacts in sequence the skew measurement point 5 on each of the microstrip lines 2. This probe movement means 6 controls the amount of movement, the direction of movement, the movement timing, etc., by a control means 7.

In addition, reference numeral 8 is a timing generation means that outputs a timing signal that is the basis of the timing axis signal, and supplies timing pulses to the electro-optic probe 4 via the known timing base circuit 9 and the pulsing circuit 10. In addition, reference numeral 11 is an amplification circuit that amplifies the timing axis signal in each microstrip line 2 that is detected by the electro-optic probe 4, this amplified output is input into a phase detection means 14 via an A/D conversion circuit 12 and an averaging processing circuit 13, and the phase of these timing axis signals can be detected at this phase detection means 14.

Furthermore, reference numeral 15 is a phase memory means that stores a pre-set phase signal as a reference value, and reference numeral 16 is a phase difference calculation means that finds by calculation the phase difference between the phase detected by the phase detection means 14 and the reference value set by the phase memory means 15. In addition, each phase control means 3 carries out phase control of the timing axis signals supplied to the microstrip lines 2 so that the phase difference obtained by the phase difference calculation means 16 is cancelled. Reference numeral 17 is a database of measured points that maintains the phase compensation value corresponding to the distance between the contact points 1 and the skew measurement points 5, and this compensation value data is supplied to the phase difference calculation means 16, etc., via the control means 7.

In addition, because the electro-optic probe 4 is not one that is used by directly electrically contacting the microstrip line 2, a location at which the skew measurement points 5 are exposed by removing a part of the insulating film (resist) covering the microstrips on a printed board can be used, or a location that directly contacts a non-contact-type probe 4 from above this insulating film can be used. Moreover, when carrying out measurement of the timing axis signal above this insulating film, there is the problem that the sensitivity degrades, but there are no problems detecting the skew.

Next, the operation is explained. First, in order to carry out the testing of the integrated circuit, timing axis signals are supplied to the microstrip lines 2 via each phase control means 3. Next, the end of the electro-optic probe 4 contacts one of the skew measurement points 5 on one of the microstrip lines 2 that is bound to each contact point 1 on the integrated circuit side. Thereby, this electro-optic probe 4 detects the timing axis signals flowing through this microstrip line 2 at the skew measurement point 5. Then, this detected signal is amplified at the amplification circuit 11 and then converted to a digital signal at an A/D conversion circuit 12. Furthermore, after averaging processing in the averaging processing circuit 13, this detected signal is input into the phase detection means 14, and there phase detection is carried out.

The phase difference between the phase of the timing axis signal on which this phase detection was carried out and the reference signal of the phase pre-set in the phase memory means 15 is found by phase difference calculation, and is input into the one phase control means 3 to which this phase difference signal corresponds. Thereby, at the phase control means 3, the supply and control of the timing axis signal that cancels the obtained phase difference to the microstrip line 2 is obtained by processing the timing signals from the timing generation means 8. In this manner, under control by the control means 7, the automatic adjustment of the timing axis phase is repeated as the electro-optic probe 4 is moved in sequence to other adjacent skew measurement points 5, and thereby timing axis signals for testing can be supplied that are adjusted so that there are timing axis discrepancies between any pins of the integrated circuit do not occur.

Moreover, because the forms of the integrated circuits are not uniform but various, by providing a database for the skew measurement points 5 for each integrated circuit, the electro-optic probe 4 can be positioned on the skew measurement points 5 by the probe movement means 6. In addition, the phase difference found by the phase difference calculation means 16 is a value obtained in the case that the distances from each contact point 1 to the skew measurement points 5 are equal, and in the case that the distances are not equal, the value is compensated based on the distance data in the database 17.

In this manner, by detecting the timing axis signals on the microstrip line 2 by an electro-optic probe 4, preparing a ground electrode for the skew measurement points is not necessary, and in addition to an increasingly higher density of the circuit pattern becoming attainable, by carrying out skew adjustment near the contact points of the integrated circuit, the skew error can be significantly decreased. In addition, the electro-optic probe 4 contacts only one point, and unlike the case of the conventional probe such as an oscilloscope that requires a signal line or earth line, no rotation operation for each movement of this electro-optic probe is necessary, and the structure and control of the probe movement means can be realized simply and at low cost. Furthermore, the influence of the ground electrical potential disappears, and accurate waveform measurement (time axis measurement) is possible. Additionally, influence on the signal line (the microstrip line) due to the measurement can be repressed.

Moreover, the signal line is not limited to a microstrip line, and any embodiment is possible if it comprises a signal line.

As described above, the present invention can supply a timing axis signal as a testing signal without time axis discrepancies between any terminal (pin) of the tested device because of having a structure characterized in providing: microstrip lines that connect to a plurality of contact points of the device under test and supply testing timing axis signals thereto; an electro-optic probe that is in proximity to the contact points and that uses the positions that are equidistant or a pre-set distance therefrom as skew measurement points and detects the timing axis signals on the microstrip lines at these skew measurement points; and a phase detection means that detects the phase of the timing axis signals that this electro-optic probe has detected; and wherein a phase difference calculation means finds the phase difference between the phase detected by this phase detection means and a pre-set reference value and carries out phase control of the timing axis signals supplied to the microstrip lines in the phase control means so as to cancel the phase difference obtained by the phase difference calculation means. In addition, the invention obtains the effects that contact (or non-contact) with one measurement point is sufficient, high density pattern distribution is possible in the non-measured part, and in addition rotation of the probe depending on the electrode of the measured point is unnecessary, and handling is simple because the terminals provided at the end of the electro-optic probe uses the generation of fluctuations in the optical characteristics due to fluctuations in the electric field of the measured part.

What is claimed is:

1. An integrated circuit tester comprising:
   microstrip lines that connect to a plurality of contact points of the device under test and supply timing axis signals for testing;
   an electro-optic probe that is in proximity to said contact points, uses positions that are equidistant therefrom or a pre-set distance therefrom as skew measurement points, and detects the timing axis signals on each of said microstrip lines at said skew measurement points;
   a phase detection means that detects the phase of the timing axis signals that said electro-optic probe detects;

a phase difference calculation means that finds the phase difference between the phase detected by said phase detection means and a pre-set reference value; and a phase control means carries out phase control of said timing axis signals supplied to said microstrip lines so that the phase differences obtained by said phase difference calculation means are cancelled.

2. An integrated circuit tester according to claim 1, wherein the phase difference obtained by said phase difference calculation means is the value obtained under the condition that there is an equal distance from each of the contact points of the device under test to each of said skew measurement points.

3. An integrated circuit tester according to claim 1, wherein the value to be used is obtained by compensating the phase difference obtained by said phase difference calculation means based on a database value of the corresponding skew measurement point in the case that the distances from the contact points of said device under test to said skew measurement points are not identical.

4. An integrated circuit tester according to claim 1, wherein the skew measurement points used by said electro-optic probe are set on an insulating film applied to said microstrip line or on said strip line having a part thereof exposed from its insulating film.

5. An integrated circuit tester according to claim 1, wherein the integrated circuit tester further comprises a probe moving means that moves said electro-optic probe according to the database values of the skew measurement points.

* * * * *